US011381319B2

(12) United States Patent
Jongsma et al.

(10) Patent No.: US 11,381,319 B2
(45) Date of Patent: Jul. 5, 2022

(54) UNDERWATER WIRELESS OPTICAL COMMUNICATION UNIT AND SYSTEM

(71) Applicant: FNV IP B.V., Leidschendam (NL)

(72) Inventors: Arnoud Marc Jongsma, Vijfhuizen (NL); Dennis Van Weeren, Leidschendam (NL); Aris Lubbes, Leidschendam (NL)

(73) Assignee: FNV IP B.V.

( * ) Notice: Subject to any disclaimer, the term of this patent is extended or adjusted under 35 U.S.C. 154(b) by 147 days.

(21) Appl. No.: 16/630,400

(22) PCT Filed: Jul. 11, 2018

(86) PCT No.: PCT/NL2018/050467
§ 371 (c)(1),
(2) Date: Jan. 10, 2020

(87) PCT Pub. No.: WO2019/013628
PCT Pub. Date: Jan. 17, 2019

(65) Prior Publication Data
US 2021/0152259 A1    May 20, 2021

(30) Foreign Application Priority Data

Jul. 11, 2017    (NL) ...................................... 2019224

(51) Int. Cl.
*H04B 10/00*    (2013.01)
*H04B 10/80*    (2013.01)
(Continued)

(52) U.S. Cl.
CPC ....... *H04B 10/80* (2013.01); *H01L 27/14643* (2013.01); *H01L 31/107* (2013.01);
(Continued)

(58) Field of Classification Search
CPC ... H04B 10/11; H04B 10/112; H04B 10/1121; H04B 10/1123; H04B 10/1125; H04B 10/1127; H04B 10/1129; H04B 10/80
See application file for complete search history.

(56) References Cited

U.S. PATENT DOCUMENTS 3,189,744 A    6/1965  Ogland
5,974,348 A    10/1999  Rocks
(Continued)

FOREIGN PATENT DOCUMENTS

EP    1983397 B1    12/2012
WO    03025854 A2    3/2003
(Continued)

OTHER PUBLICATIONS

International Search Report and Written Opinion; PCT Application No. PCT/NL2018/050467; dated Mar. 13, 2019.
(Continued)

*Primary Examiner* — Daniel G Dobson
(74) *Attorney, Agent, or Firm* — Polsinelli PC (57) ABSTRACT

An underwater wireless optical communication, UWOC, unit (30) for underwater deployment on a submerged earth layer (12) or structure (14, 16). The UWOC unit is configured for wireless optical communication in an underwater environment, and comprises an optical transmitter (36), an anidolic optical receiver (38), and a processor (44). The optical transmitter is configured to transmit data by emitting an optical signal (80) into the surroundings. The optical receiver includes an optical detector (62), which is omnidirectionally sensitive and configured to receive further optical signals approaching substantially along an azimuthal plane orthogonal to a nominal axis (A) through the UWOC unit. The processor is coupled to the optical receiver, and configured to process received further optical signals.

(Continued)

The unit may be configured to determine an inter-unit distance between this unit and a second unit, by sending an optical interrogation signal to the second unit, and receiving an optical response signal from the second unit.

13 Claims, 5 Drawing Sheets

(51) Int. Cl.

| | | |
|---|---|---|
| *H01L 27/146* | (2006.01) | |
| *H01L 31/107* | (2006.01) | |
| *H04B 10/112* | (2013.01) | |
| *H04B 10/116* | (2013.01) | |
| *H04B 13/02* | (2006.01) | |
| *H04J 14/00* | (2006.01) | |

(52) U.S. Cl.
CPC ....... *H04B 10/116* (2013.01); *H04B 10/1123* (2013.01); *H04B 13/02* (2013.01)

(56) References Cited

U.S. PATENT DOCUMENTS

| | | |
|---|---|---|
| 6,543,911 B1 | 4/2003 | Rizkin et al. |
| 8,373,862 B2 | 2/2013 | Mullen et al. |
| 2003/0193807 A1 | 10/2003 | Rizkin et al. |
| 2006/0008275 A1 | 1/2006 | Lacovara et al. |
| 2006/0171151 A1 | 8/2006 | Park et al. |
| 2014/0198206 A1 | 7/2014 | Murray |
| 2016/0121009 A1* | 5/2016 | Farr .................. G02B 19/0019 250/492.1 |
| 2016/0156420 A1 | 6/2016 | Druml et al. |

FOREIGN PATENT DOCUMENTS

| | | |
|---|---|---|
| WO | 2008027072 A2 | 3/2008 |
| WO | 2016088157 A1 | 6/2016 |
| WO | 2019013628 A2 | 1/2019 |

OTHER PUBLICATIONS

Gutierrez R.M. et al., "The silicon photmultiplier as a metasystem with designed electronics as metadevice for a new receiver-emitter in visible light communications", Visual Communications and Image Processing; Vo. 9544, Sep. 1, 2015; p. 95441P-95441P.

Khan, Mahmudur et al., "GPS-Free Maintenance of a Free-Space-Optical Link Between Two Autonomous Mobiles", vol. 16, No. 6, Jun. 1, 2017; pp. 1644-1627.

Scopigno, Riccardo et al., "The potential benefits of on-board Li-Fi for the cooperation among vehicles", 2015 17th International Conference on Transparent Optical Networks (ICTON), Jul. 5, 2015; pp. 1-6.

Danwei, Wang et al.,"Time of flight based two way ranging for real time locating systems", Robotics Automation and Mechatronics, 2010 IEEE Conference, Jun. 1, 2010; pp. 199-205.

Zafer, Sahinoglu et al. ,"Ranging in the IEEE 802.15.4a Standard", 2006 IEEE Anual Wireless and Microwave Technology Conference, Dec. 1, 2006; pp. 1-5.

Khalighi, Mohammad-Ali et al., "Underwater wireless optical communication; Recent advances and remaining challenges", Conference Paper Jul. 2014; Institut Fresnel.

\* cited by examiner

UNDERWATER WIRELESS OPTICAL COMMUNICATION UNIT AND SYSTEM

CROSS-REFERENCE TO RELATED APPLICATIONS

This application is a national stage application of International Application No. PCT/NL2018/050467, which was filed on Jul. 11, 2018, which claims priority to Netherlands Application Number 2019224 filed on Jul. 11, 2017, of which is incorporated by reference in its entirety.

TECHNICAL FIELD

The invention relates to an underwater wireless optical communication unit, to a system for underwater communication comprising a plurality of such units, and to a distance determination method methods using such a system. Furthermore, the invention relates to a computer program product arranged to perform the method, and a computer readable medium comprising such a computer program.

BACKGROUND ART

Various underwater monitoring devices are known, with sensors for observing structures that are installed underwater for a long time on the seafloor or ocean floor. Subsea monitoring devices should preferably be self-powered, energy efficient, and able to function autonomously for a prolonged time, in order to reduce required deployment and collecting operations to a minimum. In deep sea environments with typical ocean floor depths in the order of several kilometers, the sensors must additionally be able to withstand pressures of several hundred bars.

International patent publication WO2016/068715A1 describes underwater positioning systems configured to provide position information for a remotely operable vehicle (ROV). One system is formed by underwater beacons, each including an imaging device that observes the surroundings of the beacon. This imaging device is configured to detect light sources on the ROV, and to determine direction data representing a direction or change in direction of the ROV light sources with respect to the imaging device. The beacon acquires scaling information by observing a known scaling element that carries light sources at predetermined distances apart. Acquired positioning information is communicated by the beacon to the ROV via an acoustic transponder.

It would be desirable to provide a wireless communication unit that can be deployed underwater together with similar units for a prolonged time, to form a versatile system that enables various underwater monitoring tasks with improved accuracy.

SUMMARY OF INVENTION

Therefore, according to a first aspect, there is provided an underwater wireless optical communication (UWOC) unit for underwater deployment on or in a submerged earth layer or a submerged structure. The UWOC unit is configured for wireless optical communication in an underwater environment, and comprises an optical transmitter, an anidolic optical receiver, and a processor. The optical transmitter is configured to transmit data by emitting an optical signal into the surroundings of the UWOC unit. The optical receiver includes an optical detector, which is omnidirectionally sensitive and configured to receive a further optical signal approaching substantially along a first azimuthal plane that is orthogonal to a nominal axis extending through the UWOC unit. The processor is communicatively coupled to the optical receiver, and configured to process received further optical signals.

Acoustic communication channels provided by an underwater environment (e.g. the sea or ocean) are band-limited, and acoustic signals propagate through the fluid medium at relatively low speeds, resulting in high data latency. Propagating acoustic signals may also be subject to severe multipath effects, and the acoustic transmission properties of the fluid medium can vary significantly in time. In contrast, the small carrier wavelengths associated with optical data signals allow construction of small UWOC units and communication components with high resolution (e.g. a factor 10,000 compared to acoustics), low latency, and fast update rates.

The term "omnidirectionally sensitive" is used herein to refer to reception of signals approaching from any or all directions with a substantial component along an azimuthal plane around the UWOC unit. The term "azimuthal plane" is used herein to generally refer to a plane orthogonal to an axial direction on which the UWOC unit is centered. The reception sensitivity may decrease with elevation angle above or below the first azimuthal plane. The UWOC unit is capable of detecting with high sensitivity (reception gain) optical signals originating from directions substantially along this azimuthal plane, compared to signals from directions with a substantial elevation angle above or below this azimuthal plane. This elevational sensitivity reduces the likelihood that light from sources located significantly above or below the UWOC device interferes with optical communication channels established between the transmitters and receivers of cooperating UWOC units.

A plurality of the proposed UWOC units may be deployed at various positions on or in a submerged earth layer or a submerged structure, and employed as an underwater optical communication network for sharing or distributing various telemetry data to other units or underwater vehicles in the vicinity.

In embodiments wherein the UWOC unit further comprises an omnidirectional photogrammetric camera for acquiring image data within a wide field of view around the UWOC unit, the elevational sensitivity range for the optical receiver may be made substantially overlapping with or even equal to the elevational FOV range of the camera. This ensures that light signals from the optical transmitter may be received by the optical receiver and simultaneously imaged by the camera of another unit within range. For instance, for a system of such UWOC units that are deployed underwater to monitor displacement of components (e.g. wellheads and manifold) in a subsea oil extraction system, elevational sensitivity for the optical receiver and the camera of the unit may cover a minimum elevational range of −20° to +30°.

In an embodiment, the optical transmitter is configured to omnidirectionally emit the optical signal substantially along a second azimuthal plane, which is substantially parallel with the first azimuthal plane.

Also the emission of optical signals may have an omnidirectional gain profile centered on an azimuthal plane around the UWOC unit. The second azimuthal plane for optical emission may extend substantially parallel with the first azimuthal plane, and preferably at a non-zero axial distance therefrom. Omnidirectional transmission ensures that a unit is able to receive an optical signal of another unit in its vicinity, irrespective of its relative axial orientation on the submerged earth layer or structure. The omnidirectional emission gain profile may be restricted to a limited elevational range centered on the second azimuthal plane around the UWOC unit, and decrease with increasing (absolute) elevation angle above or below this azimuthal plane.

According to embodiments, the processor of the UWOC unit is configured to determine an indication of an inter-unit distance between the first UWOC unit and a second UWOC unit, on the basis of sending with the optical transmitter an optical interrogation signal to the second unit, and receiving with the optical receiver an optical response signal from the second unit (30b).

Optical transmitters and receivers of deployed units may be used to autonomously derive inter-unit ranging data, based on exchange of optical signals. In turn, such ranging information may for instance be used to determine scale characteristics for the network of deployed UWOC units. For UWOC units that also include an underwater camera for acquiring image data of light sources in the vicinity, any direction angle data acquired with such camera may be efficiently combined with the inter-unit ranging data, to confer three-dimensional positioning capabilities (e.g. range, azimuth, and elevation) to the UWOC unit.

In further embodiments, the UWOC unit is configured to send with the optical transmitter an optical response signal to a second UWOC unit, upon receiving an optical interrogation signal from the second unit. The UWOC unit may then be configured to measure a roundtrip time (RTT) between sending the optical interrogation signal to the UWOC second unit, and receiving the optical response signal from the second unit.

Alternatively or in addition, the UWOC unit may be configured to determine the inter-unit distance by comparing phase and frequency characteristics of the clocks of the first and second UWOC units, after exchange of optical signals with predetermined carrier wave characteristics.

In embodiments, the optical detector comprises a silicon photomultiplier (SiPM) sensor.

Due to considerable photon detection efficiency, high detection gain, and fast response times achievable with a SiPM sensor, a SiPM sensor may be effectively employed for wireless optical communication in an underwater environment. The low driving voltage requirement renders the SiPM sensor particularly suitable for long-term underwater deployment. At considerable water depths (e.g. depths greater than 500 meters) there is no ambient light disturbance due to sunlight left, so the environment is completely dark all the time. The superior sensitivity, response, and gain characteristics of SiPMs render this sensor particularly suitable for subsea light detection applications. UWOC units that have inter-unit ranging capability may particularly benefit from detector implementations that employ such a (fast responding) SiPM sensor.

In embodiments, the optical detector defines a sensor surface. The optical signal receiver may comprise first reflector optics, which is adapted to receive the further optical signal approaching substantially along the first azimuthal plane, and to reflect the further optical signal towards and onto the sensor surface.

In a further embodiment, the sensor surface is substantially planar. The first reflector optics may then include a conical mirror with a top directed towards the optical detector. This conical mirror may be centered on an axis of revolution that extends through the sensor region and is substantially parallel with the nominal axis.

Alternatively, the first reflector optics may include a plurality of conical mirrors arranged rotationally symmetric around the unit axis, each mirror being centered on an axis of revolution that extends through the sensor region and is at a non-zero distance from and substantially parallel with the nominal axis.

The proposed reflector optics with one or more conical mirrors provides omnidirectional azimuthal detection sensitivity to the optical detector, while allowing robust alignment of the detector optics inside the unit's housing. The elevational sensitivity of the optical signal receiver can be adjusted by changing the maximum diameter of the conical mirror (i.e. the maximal radial extent of the mirror relative to its axis of revolution).

The one or more conical mirrors may each define an inverse parabolic conical mirror surface. The term "inverse parabolic conical surface" is used herein to refer to a surface of revolution formed from a parabolic segment described by $x = a \cdot y^2 + b$, wherein the y-coordinate is associated with the axis of revolution. (In the case of a mirror with a downwards top, $a > 0$; $x > 0$; and $y > 0$).

In further embodiments, the UWOC unit comprises a housing including an optically transparent body formed by a solid of revolution, which is centered on the unit axis and has an outer surface with a convex curvature along radial and axial directions and a center of curvature located on the unit axis. The first reflector optics may be accommodated inside this transparent body and located substantially at the center of curvature of the convex body surface.

The proposed body provides a pressure-resistant and optically transparent housing, in which the signal receiver can be reliably accommodated and attributed an omnidirectional azimuthal view. The curved solid of revolution may for instance have a (truncated) spherical outer surface.

In further embodiments, the SiPM sensor includes sensor elements and a frontend circuit. The frontend circuit includes a voltage source for providing the sensor elements with a reversed bias voltage, and a low-pass filter that is provided between and electrically connected to the sensor elements and the voltage source, and which is configured to suppress or even eliminate frequency components of 100 hertz and above in/from the bias voltage. The low-pass filter may for instance be formed by an RC-filter.

By applying a sufficient reverse bias voltage across the elements of the SiPM sensor (e.g. about 24 volts), the sensor elements are capable to generate self-sustaining avalanche currents upon absorption/detection of a photon. The output signal of the sensor may suffer from intermodulation distortion effects, though, which may be caused by non-linear response of the sensor to a changing bias voltage resulting from simultaneous detection of the target light signal and other external light sources with different frequency characteristics, such as pulse width modulated (PWM) dimmable LED sources on other objects in the unit's vicinity (e.g. an ROV or UAV with LED spotlights). Typical PWM LED driving frequencies range from 100 hertz up to values in the order of hundreds of kilohertz, for instance up to 500 kHz. Intermodulation distortion in the SiPM caused by the bias circuit may be reduced by using the low-pass filter, which decouples the SiPM bias voltage over a wide frequency bandwidth, e.g. of 100 kHz and above, and keeps the bias voltage as constant as possible.

Alternatively or in addition, the optical transmitter may be configured to form the optical signal by modulating a carrier wave with a frequency of at least 500 kilohertz using a modulation with a predetermined maximum bitrate. The SiPM sensor may then include a frontend circuit with an analogue-to-digital converter (ADC), and a parallel resonant band-pass filter. The band-pass filter is provided between and electrically connected to the sensor elements and the ADC, and is configured to pass only a frequency band corresponding with the carrier wave and the maximum bitrate. The band-pass filter may for instance be formed by a parallel L/C filter.

The optical communication signals from the units may for instance be formed by modulating data signals via binary phase shift keying (BPSK) or differential phase shift keying (DPSK) with a predetermined maximum bitrate onto a high frequency carrier wave with a frequency of at least 500 kHz, for instance of about 800 kHz. Even if the data rate in the wireless optical communication channel is relatively low, e.g. in the order corresponding with a 25 kHz bitrate, it may still be beneficial to use a carrier wave at a frequency that is considerably higher than (e.g. at least 500 kHz) switching frequencies of external artificial light sources. This allows spectral bands associated with the desired communication signal to be clearly separable from spectral bands associated with other external light sources, via bandpass filtering of the SiPM output signal, to improve analog signal-to-noise performance. Due to the high frequency subcarrier of the communication signals, a parallel LC filter may be used to pre-filter the output signal of the sensor elements of the SiPM sensor, before it is digitized by the ADC. The band-pass filter is preferably tuned to pass the entire band containing the communication channel for the maximum data rate that it is designed for.

According to a second aspect, and in accordance with advantages and effects described herein above with reference to the first aspect, there is provided an UWOC system for optical communication in an underwater environment, and comprising at least a first and a second UWOC unit according to the first aspect. The first and second optical transmitters of the respective UWOC units are each configured to omnidirectionally emit a respective optical signal. The first and second optical receivers of the respective UWOC units are each omnidirectionally sensitive and configured to receive the respective optical signal emitted by the second or first optical transmitters respectively.

In an embodiment, the first UWOC unit is configured to determine an indication of an inter-unit distance between the first UWOC unit and the second UWOC unit, on the basis of sending with the optical transmitter an optical interrogation signal to the second UWOC unit, and receiving with the optical receiver an optical response signal from the second UWOC unit.

The first UWOC unit may for instance be configured to derive a TOF for an optical signal travelling between the first UWOC unit and the second UWOC unit, on the basis of measuring RTT with the first UWOC unit via sending the optical interrogation signal to the second UWOC unit and receiving the optical response signal from the second UWOC unit. In this case, the second UWOC unit is configured to send the optical response signal to the first UWOC unit upon receiving the optical interrogation signal from the first UWOC unit, and the processor of the first UWOC unit is configured to determine the inter-unit distance on the basis of the TOF. Such distance determination requires knowledge of a propagation velocity of the optical signal through the intervening liquid, which may be based on a predetermined model and/or on measurements. Initial knowledge of various time biases (e.g. component time delays) may also be provided in advance.

Alternatively, the UWOC units are configured to determine the inter-unit distance by deriving phase and frequency differences between the clocks of the first and second UWOC units, via exchange of optical interrogation and response signals with predetermined carrier waves and comparison of received signals with internal clocks. The first unit may transmit an optical interrogation signal including a carrier wave, which may be received by the second unit. The second unit compares the interrogation signal with the frequency and phase characteristics of its own clock for generating an optical carrier wave, derives phase differences between the signal and its clock, and stores the results. Optionally, the second unit may also derive frequency differences between the received signal and its clock, and store the results for future transmission or comparison purposes. The second unit transmits its clock back to the first unit via an optical response signal. The first unit similarly compares the received response signal with its own clock, to measure phase and frequency differences between the clocks of the units. In addition, the second unit transmits the stored phase (and possibly frequency) differences to the first unit. The first unit may then resolve the inter-unit distance with an ambiguity of one clock period. This ambiguity may be resolved by modulating the clock with additional information. The optional determination and transmission of frequency differences by the second unit and receipt thereof by the first unit allows the first unit to determine an average frequency difference (e.g. to reduce measurement noise) and/or to detect and possibly compensate for potential frequency drift over time.

According to a third aspect, there is provided a method for using the UWOC system according to the second aspect. The method comprises:
  deploying first and second UWOC units underwater at non-coinciding first and second positions on or along a submerged surface or structure, followed by:
  emitting an optical interrogation signal with a first optical signal transmitter of the first UWOC unit;
  receiving the optical interrogation signal with a second optical signal receiver of the second UWOC unit;
  emitting an optical response signal with a second optical signal transmitter of the second UWOC unit after receiving the optical interrogation signal;
  receiving the optical response signal with the first optical signal receiver of the first UWOC unit, and
  determining an indication of an inter-unit distance between the first and second positions, based on at least the optical response signal from the second UWOC unit.

In one embodiment, the method comprises:
  determining a TOF for an optical signal (e.g. the interrogation signal and/or response signal) travelling between the first and second UWOC units, based on a time difference between the emission of the optical interrogation signal and the receipt of the optical response signal, and
  determining the indication of inter-unit distance between the first and second positions from the TOF.

The first UWOC unit may transmit an optical pulse or optical pulsed carrier as interrogation signal to the second unit at time T0. The second unit receives the signal at T0+ΔTab (i.e. TOF), and promptly returns a similar optical response signal at T0+ΔTab+ΔTb (fixed time offset) to the first unit. The first unit may then receive this response signal at T0+2·ΔTab+ΔTb. From the elapsed RTT=2·ΔTab+ΔTb measured by the first unit, the TOF between the units can be derived. Based on advance knowledge of (average/modelled/measured) light propagation speed in the intervening liquid and of system time delays, the unit's processor may derive the inter-unit distance from the TOF.

In alternative embodiments, indications of inter-unit distances may be determined by measuring phase differences Δφ and frequency differences Δω between internal clocks and received optical signals of distinct UWOC units, via method steps described herein.

According to a further aspect, there is provided a computer program product configured to provide instructions to carry out a method according to at least one the abovementioned aspects, when loaded on a computer arrangement.

In yet a further aspect, there is provided a computer readable medium, comprising such a computer program product.

BRIEF DESCRIPTION OF DRAWINGS

Embodiments will now be described, by way of example only, with reference to the accompanying schematic drawings in which corresponding reference symbols indicate corresponding parts. In the drawings, like numerals designate like elements. Multiple instances of an element may each include separate letters appended to the reference number. For example, two instances of a particular element "20" may be labeled as "20a" and "20b". The reference number may be used without an appended letter (e.g. "20") to generally refer to an unspecified instance or to all instances of that element, while the reference number will include an appended letter (e.g. "20a") to refer to a specific instance of the element.

The figures are meant for illustrative purposes only, and do not serve as restriction of the scope or the protection as laid down by the claims.

DESCRIPTION OF EMBODIMENTS

The following is a description of certain embodiments of the invention, given by way of example only and with reference to the figures.

In the next figures, various coordinate systems will be used to describe spatial characteristics and relations for exemplary embodiments of the observation unit and system. The "unit axis" A refers herein to a nominal axis through an observation unit, and on which an imaging device of the unit is centered. The "axial direction" Z is used herein to refer to the direction along this unit axis A. The term "radial direction" R refers herein to the directions that point radially away from the unit axis A (i.e. perpendicular to the axial direction Z), and which lie in a transversal plane for which a surface normal vector points along the axial direction Z.

The "angular direction" (or "azimuthal direction") 1 corresponds to a unit-vector that initiates at a local radial position, and which points anti-clock-wise along an (infinitesimal) angle of rotation about the unit axis A, and perpendicular to both the (local) radial and axial directions R, Z. Any radial-angular plane transverse to the axial direction Z is referred to herein as an "azimuthal plane" P.

The term "surface" is used herein to generally refer to a two-dimensional parametric surface region, which may have either an entirely or piece-wise flat shape (e.g. a plane or polygonal surface), a curved shape (e.g. cylindrical, spherical, parabolic surface, etc.), a recessed shape (e.g. stepped or undulated surface), or a more complex shape. The term "plane" is used herein to refer to a flat surface defined by three non-coinciding points.

It should be understood that the directional definitions and preferred orientations presented herein merely serve to elucidate geometrical relations for specific embodiments. The concepts of the invention discussed herein are not limited to these directional definitions and preferred orientations. Similarly, directional terms in the specification and claims, such as "top," "bottom," "left," "right," "up," "down," "upper," "lower," "proximal," "distal" and the like, are used herein solely to indicate relative directions and are not otherwise intended to limit the scope of the invention or claims.

Figure 1:
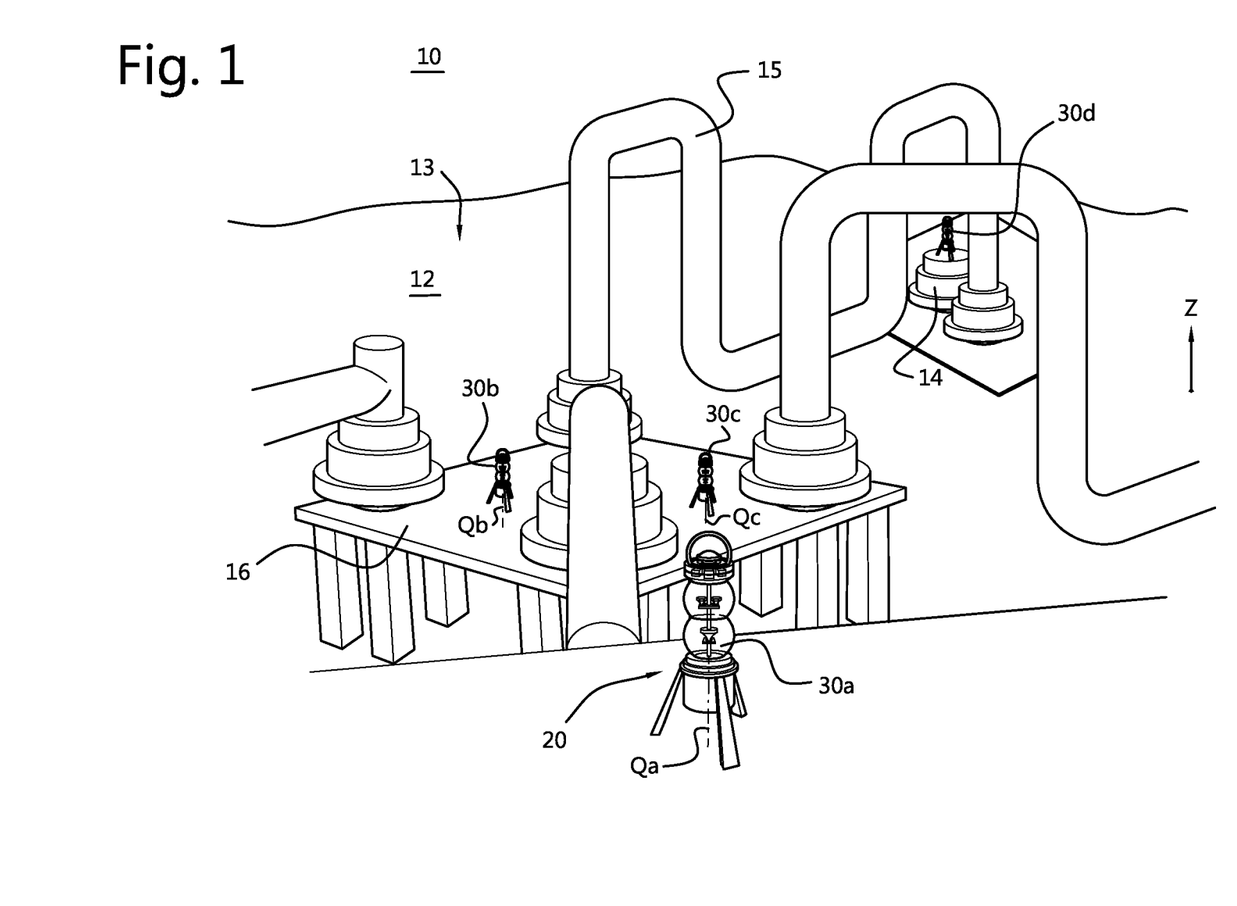
FIG. 1 schematically shows an embodiment of an observation system, deployed underwater on submerged structures and supporting surface.

FIG. 1 schematically shows a perspective view of an exemplary observation system 20 deployed underwater. The system 20 includes a plurality of observation units 30a, 30b, 30c, 30d, which are all immersed in a body of water 10, and are positioned at respective positions Qa, Qb, Qc on submerged structures 14, 16. The submerged structures 14, 16 are arranged across a submerged surface 13, which forms a water-soil interface between the above-situated body of water 10 and the earth layer 12 below. In this example, the submerged surface 13 forms the surface of a portion of a seabed 12, and the submerged structures 14, 16 form part of a subsea oil extraction system, which includes several wellheads 14 and at least one production manifold 16 that is connected to the wellheads 14 via jumpers 15. The surface 13 of the seabed 12 is typically not perfectly planar, but has local height variations with respect to a vertical direction Z (corresponding with gravity).

The observation units 30 include watertight enclosures, and can be deployed in submerged environments for a long term (e.g. years). Once deployed, the units 30 are configured to establish communication channels between pairs of units 30 to form a meshed network. The units 30 are also configured to acquire image data of each other and of the surroundings at desired periods and update rates, and to exchange acquired data via the communication channels. The units 30 are interchangeably referred to herein as observation units or as underwater wireless optical communication (UWOC) units.

Although four observation units 30 are illustrated in FIG. 1, it should be understood that a greater or smaller number of units can be employed. An increased number of deployed units in the meshed network arrangement allows a larger and/or denser spatial coverage, and may provide increased measurement redundancy which may be exploited to improve measurement accuracy and reliability of the system 20.

Figure 2:
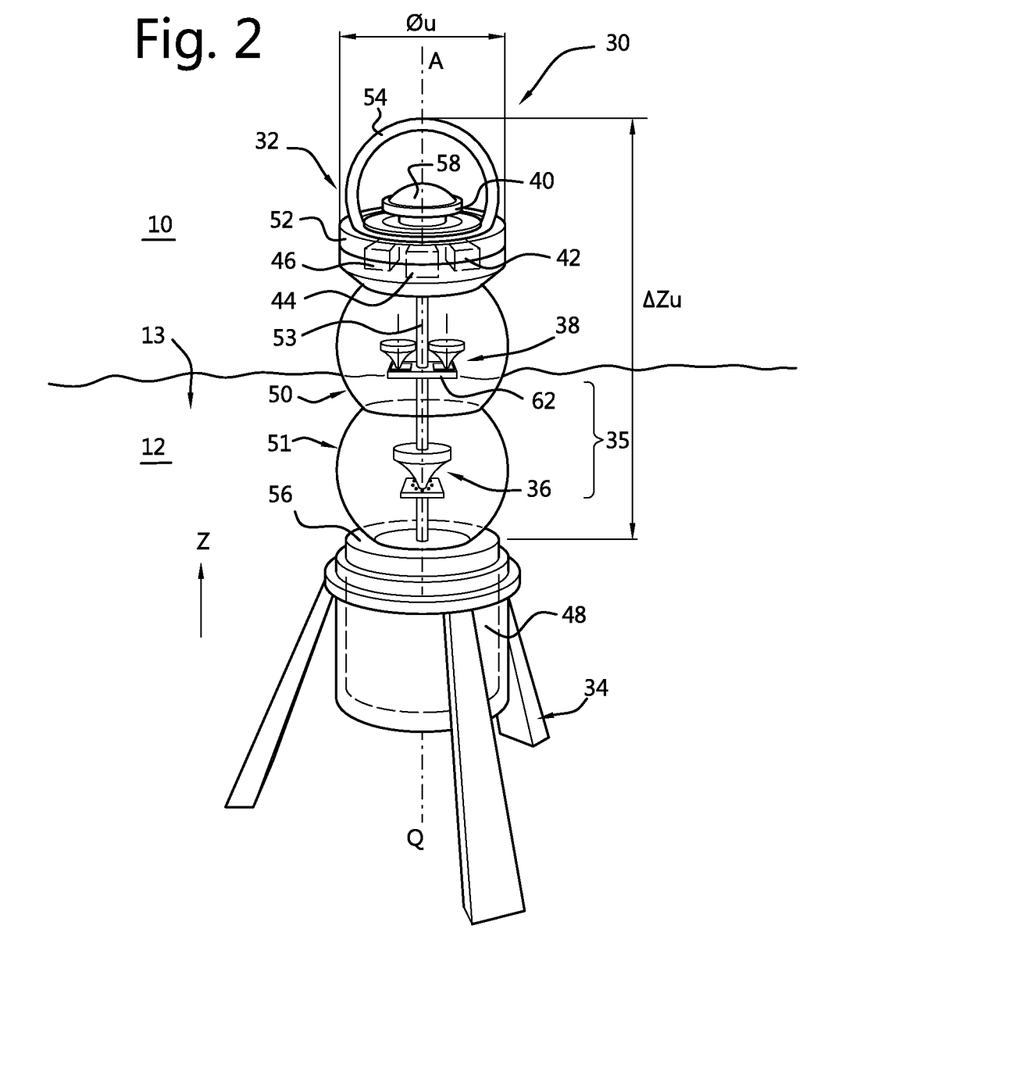
FIG. 2 presents a perspective view of an embodiment of an observation unit, deployed underwater on an submerged surface.

FIG. 2 presents a perspective view of an exemplary observation/UWOC unit 30, which is part of the system 20 shown in FIG. 1, and which is deployed underwater on the seafloor 13.

The observation unit 30 comprises a housing 32, which accommodates various sensors 38, 40, 42 and other electronic components 36, 44, 46, 48 in a watertight and pressure resistant manner. The housing 32 is at a lower distal portion 56 coupled to a base 34. The base 34 defines a support structure for the housing 32, and accommodates a power supply 48, which is electrically coupled to the sensors 38, 40, 42 and the other electronic components 36, 44, 46 to provide required electrical power. The base 34 further includes a support arrangement, which in this example is a tripod leg structure on a lower side, and which is adapted to support the base 34 and underwater observation unit 30 relative to the seabed 12 or structure 14, 16. In this example, the power supply 48 is formed by a replaceable seawater battery, which is known per se. The base 34 is selectively detachable from the housing 32, to allow the battery 48 to be replaced.

The housing 32 of the unit 30 includes an optically transparent medial portion 50, 51 with an optical communication device 35 inside, a component casing 52, and a transparent dome 54 with an optical imaging device 40 on an upper side of the housing 32. The medial portion 50, 51, the component casing 52, and the dome 54 jointly form an elongated body that extends along a central unit axis A. In this example, the unit 30 is essentially rotationally symmetric about the unit axis A. The medial portion 50, 51, the component casing 52, and the transparent dome 54 are essentially continuously rotationally symmetric about unit axis A, whereas other unit components have discrete rotational symmetries about axis A (e.g. the base 34 has three-fold symmetry, and the communication device 35 has two-fold symmetry).

In a deployed state of the unit 30, the unit axis A is preferably directed with a substantial component normal to the (macroscopic) orientation of the supporting submerged surface 13 or structure 14, 16, to allow the optical communication device 35 and the imaging device 40 a largest possible unobstructed FOV. Furthermore, the deployed observation units 30 project with at least the medial portion 50, 51, the component casing 52, and the transparent dome 54 above the surface 13 of the seabed 12. This allows the imaging device 40 of one unit 30 to observe the unit's surroundings and to provide the optical communication device 35 a line of sight to communication devices 35 of one or more other units 30 in the vicinity. The achievable visual and/or optical communication range between units 30 deployed underwater may be in the order of several hundreds of meters. In this example, the units 30 are relatively small; A height ΔZu of the housing 32 (from 56 to the top of dome 54) along the axis A is several tens of centimeters e.g. about 25 centimeters, and diameter Øu of the housing 32 transverse to the axis A is about 10 centimeters.

The component casing 52 forms a pressure resistant shell, which consists essentially of Titanium and defines an internal chamber for accommodating an orientation sensor 42, a processor 44, and a memory unit 46. Titanium is a strong, light, and corrosion-resistant metal. In addition, the thermal expansion coefficient of Titanium can advantageously be selected to approach or even match the thermal expansion coefficient of particular types of glass that may be used for forming the dome 54 and/or the medial portions 50, 51, to reduce differential thermal stress between these parts (and potential negative optical effects) under varying temperature conditions.

The medial portion 50, 51 is formed by a first medial portion 50 and a second medial portion 51, which are stacked along and centered on the unit axis A, and which accommodate distinct functional parts of the optical communication device 35. The communication device 35 includes an optical signal transmitter 36, and an optical signal receiver 38 of the anidolic (non-imaging) type.

The optical signal transmitter 36 includes a plurality of light sources (70, see FIG. 4), and is configured to transmit an optical data signal via light that is emitted by the light sources 70, through the second medial portion 51, and into the body of water 10 surrounding the unit 30.

The imaging device 40 is formed by a photogrammetric camera 40 with an ultra-wide field of view (UW-FOV), which is configured to acquire image data of objects located in the vicinity of the unit 30. The camera 40 is configured to detect and acquire image data of other light sources in the vicinity of the unit 70.

In this example, the camera FOV faces away from the housing 32 and upwards along the unit axis A, to ensure that portions of the housing 32 are not within the camera FOV when the observation unit 30 is deployed. In particular, the camera FOV faces away from the optical signal transmitter 36 of the optical communication device 35.

The orientation sensor 42 is configured to acquire attitude data for the unit 30, by determining at least a pitch and a roll of the underwater imaging device 40 relative to the surface 13 or structure 14, 16 on/in which the unit 30 is deployed.

The processor 44 and memory unit 46 are communicatively coupled with the orientation sensor 42, to receive and store the attitude data acquired by the orientation sensor 42. The processor and memory units 44, 46 are also coupled with the camera 40, to receive and store image data acquired by the camera 40. Furthermore, the processor and memory units 44, 46 are coupled to the communication device 35.

A cable router tube 53 is provided through the medial part 50, 51 of the housing 32 and along the unit axis A. The processor and memory units 44, 46 are electrically connected with the communication device 35, via signal conduits. In addition, the communication device 35 and other sensors 40, 42 and electronic components 44, 46 are electrically coupled to and powered by the power supply 48 via power conduits. In addition, a data port (not shown) may be provided in the base 34 or at an underside of the housing 32, which is electrically connected to the processor and memory units 44, 46 via further signal conduits. This data port may be configured for downloading measurement data and/or uploading configuration data (e.g. for upgrading firmware) once the unit is recovered from the seafloor 13. The tube 53 accommodates the various conduits and prevents optical masking of the signal transmitter and receiver 36, 38.

The processor 44 is configured to receive the image data from the camera 40, and to determine positional data of the second light source relative to the camera 40. The memory unit 46 is configured for storing the positional data with timestamps, to form a dataset of time-dependent positional data. The communication device 35 is configured to transmit the positional data to other underwater observation units 30b, 30c, 30d, a nearby underwater vehicle 18, and/or an underwater processing station.

Figure 3:
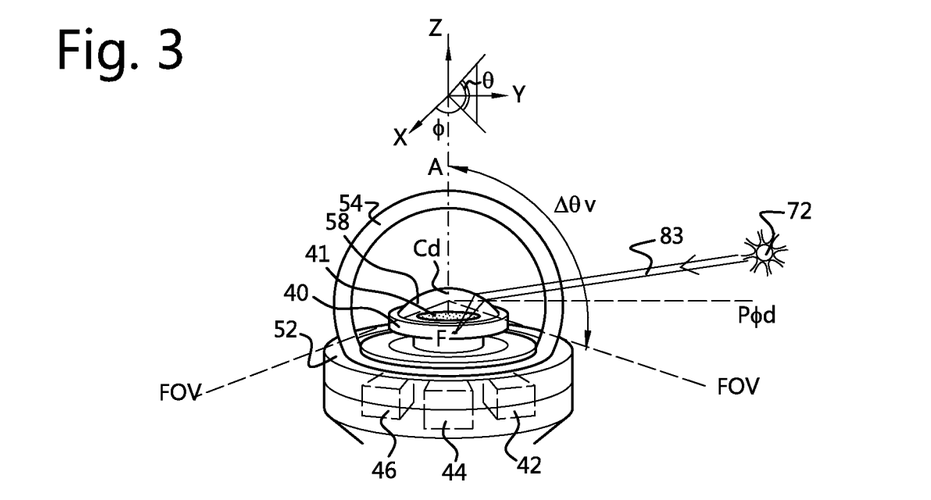
FIG. 3 shows a side view of an upper portion of the observation unit from FIG. 2.

FIG. 3 shows a schematic side view of the upper portion of the observation unit 30 from FIG. 2, including the transparent dome 54 with camera 40. The camera 40 is accommodated inside the dome 54, and includes a digital imaging sensor 41 and a fish-eye lens 58 for receiving and refracting light from the surroundings and projecting the light onto the sensor 41. The imaging sensor 41 includes a two-dimensional (2D) array of pixels.

The transparent dome 54 is formed as a hyper-hemispherical shell of optically transparent material, which is sufficiently rigid to resist considerable external pressures associated with underwater deployment without significant deformation. The camera 40 is positioned with its fish-eye lens 58 substantially coinciding with a nominal center of curvature Cd of the dome 54. The spherical portion of the dome 54 extends over an azimuthal range of 360° and an elevational range that at least equals the elevational coverage ΔΘv of the camera's FOV.

The fish-eye lens 58 confers an omnidirectional UW-FOV to the camera 40. In this example, the camera FOV covers 360° in the azimuthal plane $P_{\varphi d}$. The camera FOV has an elevational coverage ΔΘv of –20° to 90° relative to the azimuthal plane $P_{\varphi d}$. The resulting UW-FOV allows instantaneous imaging of a large portion of the unit's surroundings. The UW-FOV covers a relatively narrow elevational range around the azimuthal plane $R_{\varphi d}$, in which other units 30 are expected to be located, but also larger elevational angles corresponding with an upwards region in which underwater vehicles 18 (e.g. an ROV or UAV) are expected to move around.

The fish-eye lens 58 has a focal length that is slightly larger than the distance to the sensor 41, so that a focal point F of an imaged light signal 83 from a point-like light source 72 will be located slightly behind the imaging sensor 41. Such a point-like light source 72 may for example correspond to the optical signal 80 from an optical signal transmitter 36 of a visible but remote other unit 30. Light received from a point-like light source 70 will thus be projected slightly out of focus onto the imaging sensor 41, to generate an image blob that extends over multiple adjacent pixels of the array.

Figure 4:
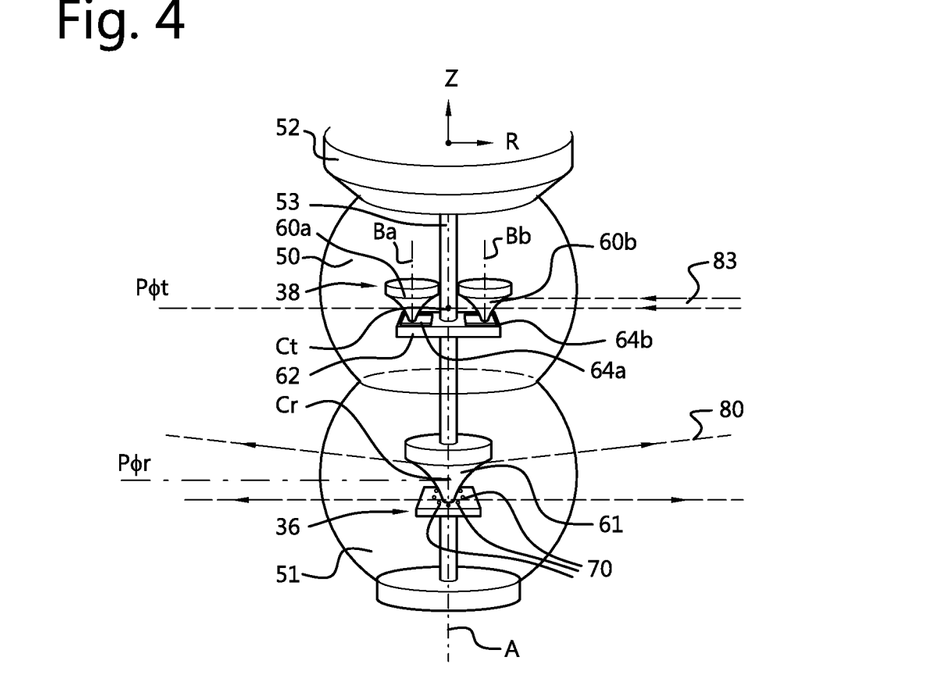
FIG. 4 shows a side view of a medial portion of the observation unit from FIG. 2.

FIG. 4 shows a schematic side view of the transparent medial portion 50, 51 of the UWOC unit 30 from FIG. 2. The medial portion 50, 51 is formed by a first medial housing portion 50 and a second medial housing portion 51. Exemplary materials for the medial portions 50, 51 are glasses or acrylic glasses. The medial housing portions 51, 52 are formed as truncated spheres that consist essentially of pressure-resistant and optically transparent material, and which are mutually stacked and coaxially arranged around the unit axis A. Each medial housing portion 51, 52 has an outer surface with a convex curvature along radial and axial directions R, Z, and an associated center of curvature Ct, Cr located on the unit axis A.

The optical signal receiver 38 is of an anidolic type. The optical signal receiver 38 is accommodated in the first medial housing portion 50, and includes a detector 62 with SiPM sensors 64a, 64b and first reflector optics 60a, 60b.

The first reflector optics 60a, 60b are positioned with volumetric center substantially coinciding with a nominal center of curvature Ct of the first medial housing portion 50. The first reflector optics 60 includes an inverse parabolic conical reflector 60a, 60b for each associated SiPM 64a, 64b. Each reflector 60 is adapted to reflect incoming light signals 83 that radially approach with a substantial component along a first azimuthal plane $R_{\varphi r}$, and to project the reflected light onto the associated SiPM 64a, 64b. The reflectors 60 are arranged inside the first medial portion 50 with two-fold (180°) rotational symmetry around the unit axis A. The axis of revolution Ba, Bb of each reflector 60 is parallel with the unit axis A, and the (possibly truncated) top of each mirror is directed toward the associated SiPM 64a, 64b.

The optical signal transmitter 36 is accommodated in the second medial housing portion 51, and includes light sources 70 and second reflector optics 61. The light sources 70 are formed by LED units that are arranged in a regular azimuthal distribution around the unit axis A, and which are adapted to emit light with wavelengths substantially in an optical range of 300 nanometers to 600 nanometers.

The second reflector optics 61 are formed by another parabolic conical reflector 61, which is adapted to reflect optical signals 80 emitted by the LEDs 70 outwards, with a substantial component along a second azimuthal plane $R_{\varphi t}$ that is parallel with the first azimuthal plane $R_{\varphi r}$. The second reflector optics 61 are positioned with its volumetric center substantially coinciding with a nominal center of curvature Cr of the second medial housing portion 51.

The processor 44 and memory unit 46 are communicatively coupled with the optical signal receiver 38 via the cable router tube 53, to receive and store data acquired by the SiPMs 64a, 64b. The processor unit 44 is also communicatively coupled with the optical signal transmitter 36 via the cable router tube 53, to control the emission of optical signals 80 by the LEDs 70.

Figure 5:
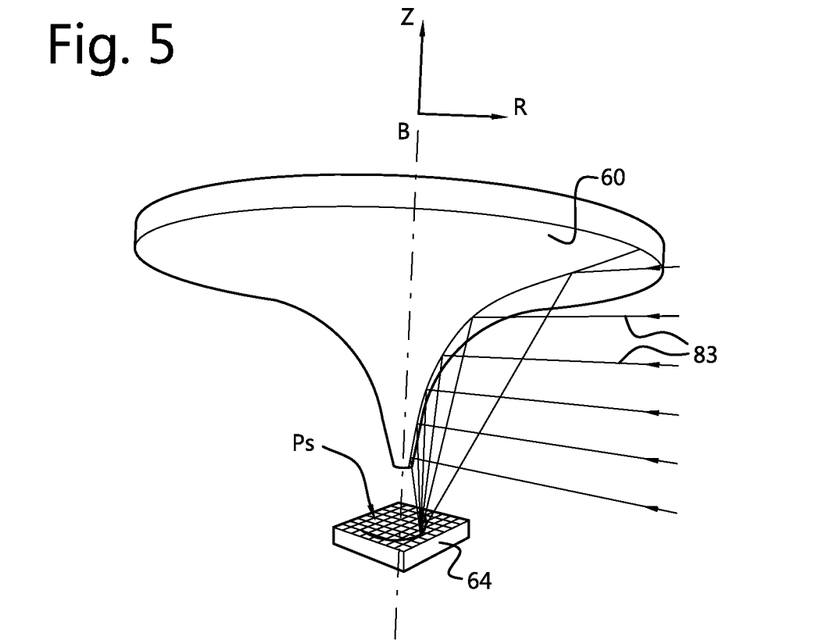
FIG. 5 presents a perspective view of another embodiment of an observation unit, deployed underwater on an submerged surface.

FIG. 5 shows a schematic perspective view of one of the conical reflectors 60a, 60b in the optical signal receiver 38. The parabolic conical reflector 60 is formed as an inverse parabolic cone with an outer surface of optically reflective material, and with an annular focal region that coincides with the planar sensor surface Ps of the associated SiPM 64a, 64b. The conical mirror 60 is centered on an axis of revolution B, which extends through the sensor region Ps of the underlying SiPM 64, and is substantially parallel with the axis A of the UWOC unit 30. The truncated top of the mirror 60 faces the SiPM 64.

A parabolic cone allows all light rays from a particular radial direction (i.e. particular value for the azimuth angle) to be projected onto a single focal point of the parabola. FIG. 5 shows radial parallel light rays of an incoming optical signal 83, and reflection thereof by the reflector 60 towards this focal point and onto the sensor surface Ps of the SiPM 64.

The parabolic conical reflector 61 of the optical signal transmitter 36 has a similar shape and will reflect optical signals 80 emitted by the LEDs 70 radially outwards. This reflector 61 is centered on an axis of revolution which essentially coincides with the axis A of the UWOC unit 30.

Figure 6:
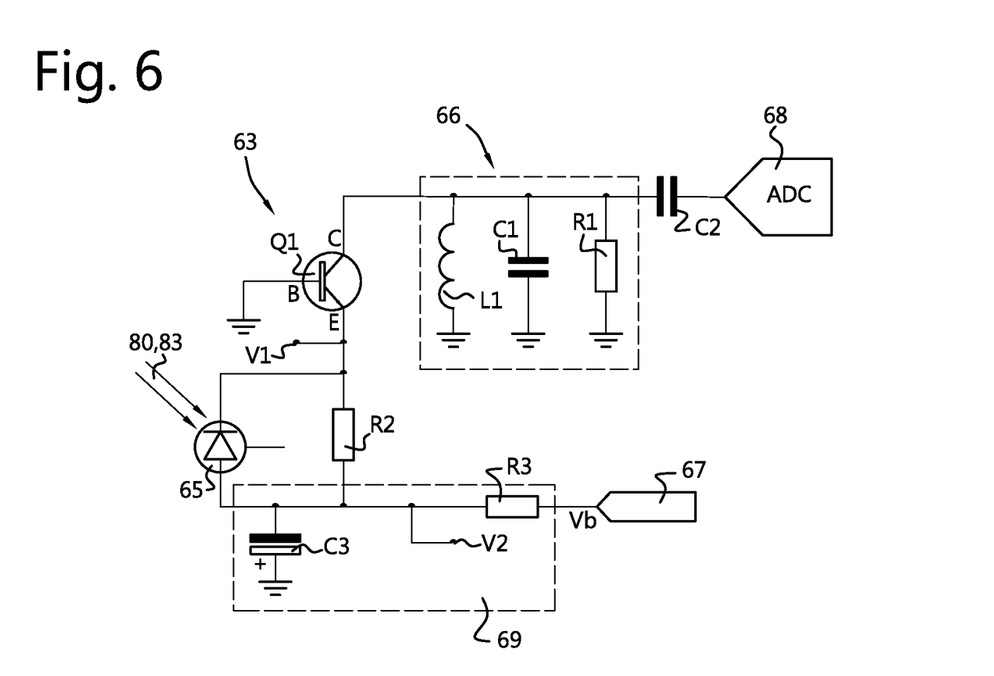
FIG. 6 illustrates a schematic diagram for a frontend circuit of an optical detector, according to an embodiment.

FIG. 6 illustrates a schematic diagram for a frontend circuit 63 of an exemplary SiPM-based optical detector 62. The SiPM detector 62 includes a matrix of reverse biased Geiger Mode avalanche photodiodes (APD), which are connected in parallel between a common cathode and a common anode, and which are collectively indicated in FIG. 6 by reference numeral 65. The frontend circuit 63 includes a voltage source 67, a transistor Q1, an ADC 68, and various passive electric components R1, R2, R3, C1, C2, C3, L1.

The voltage source 67 is configured to provide the APD elements 65 with a (reversed) bias voltage Vb. The gain of a SiPM element 65 (in the order of $10^6$) is highly dependent on the bias voltage Vb across the SiPM elements 65. The bias voltage Vb is formed by a sum of a breakdown voltage Vbd and an overvoltage Vo (e.g. around 3V). The breakdown voltage Vbd is a minimum reverse bias voltage that is needed to induce self-sustaining avalanche multiplication in an APD element 65 upon absorption/detection of a photon (e.g. around 24V).

To achieve a constant gain (linear operation), it is preferred to keep the bias voltage Vb constant. A maximum current through an APD element 65 should be limited, however, to avoid damaging of the element 65. This may be achieved by providing resistor R3 in series with the elements 65. Using only resistor R3 will cause a voltage across the APD element 65 to vary with the intensity of the light 83 it receives, and therefore cause the gain to vary as well. This causes non-linear amplification of a stream of photons associated with received light 83, which are converted into an electrical current.

The optical transmitter 36 of the observation/UWOC unit 30 is configured to form an optical communication signal 80 by modulating a carrier wave with a frequency of at least 500 kHz, in this example of 800 kHz, using a modulation with a predetermined maximum data bitrate. If the elements 65 only receive photons from a modulated source of interest (in this case, the communication signal 80 from another unit 30), the non-linear amplification effect is less problematic. If, however the APD element 65 simultaneously receives light signals from other (unwanted) modulated sources, the non-linear response of the APD elements may cause intermodulation distortion (IMD) i.e. additional signal components at frequencies that are sums and differences of integer multiples of the original signal frequencies for the light of interest and the other sources. In a deep subsea environment, ambient sunlight is absent, but there may be artificial light sources (i.e. ROV lights), which are typically pulse width modulated.

The frontend circuit 63 therefore also includes a capacitor C3, to form with resistor R3 a low-pass RC filter 69. The RC-filter 69 is provided between and electrically connected to the sensor elements 65 and the voltage source 67. In this example, C3 is a polarized electrolytic capacitor. The RC-time constant of the filter 69 is selected to be larger than the expected PWM period. The RC-filter 69 is thus configured to attenuate time fluctuations in the bias voltage Vb, in order to keep Vb at/near an average value. The occurrence of intermodulation products with components within the frequency band associated with the carrier frequency and modulation bitrates of the optical communication signal can thus be reduced or even eliminated.

In use, a voltage V1 on the cathode side of the APD elements 65 is kept constant through transistor Q1, and a base B of transistor Q1 is connected to ground. Resistor R2 is connected in parallel with the elements 65, and allows voltage V1 to be kept constant, even in the case that no light is received by the APD elements 65 (i.e. a current through elements 65 is almost zero).

The frontend circuit 63 further includes a parallel LC band-pass filter 66, which includes in parallel, an inductor L1, a capacitor C1, as well as a resistor R1 for tuning filter quality. The LC-filter 66 is provided between and electrically connected to the sensor element 65 and to the ADC 68. This LC-filter 66 is tuned via selection of appropriate values for L1, C1, and R1, to pass only a frequency band corresponding with the carrier wave and the maximum bitrate of the optical communication signals 80 from the transmitters 36. The subcarrier frequency on which the optical communication signal 80 is modulated, is chosen to be much higher (e.g. >500 kHz) than the highest expected PWM frequency of ROV LED sources (and possibly also higher harmonic frequencies). The LC-filter 66 provides analogue pre-filtering to suppress any frequency components outside the band of interest. The required bandwidth for signal 80 around the subcarrier equals the data rate, so an exemplary bit rate of 25 kHz would require the LC filter 66 to be tuned to a band of approximately 787 kHz to 813 kHz.

Alternative resonators could be used (i.e. a quartz crystal or ceramic resonators) to achieve the above frequency filtering. For instance, an RF choking coil may be used to supply DC current to the collector of transistor Q1. A quartz crystal resonator might be of interest in very low bandwidth applications to improve the signal to ratio.

Figure 7:
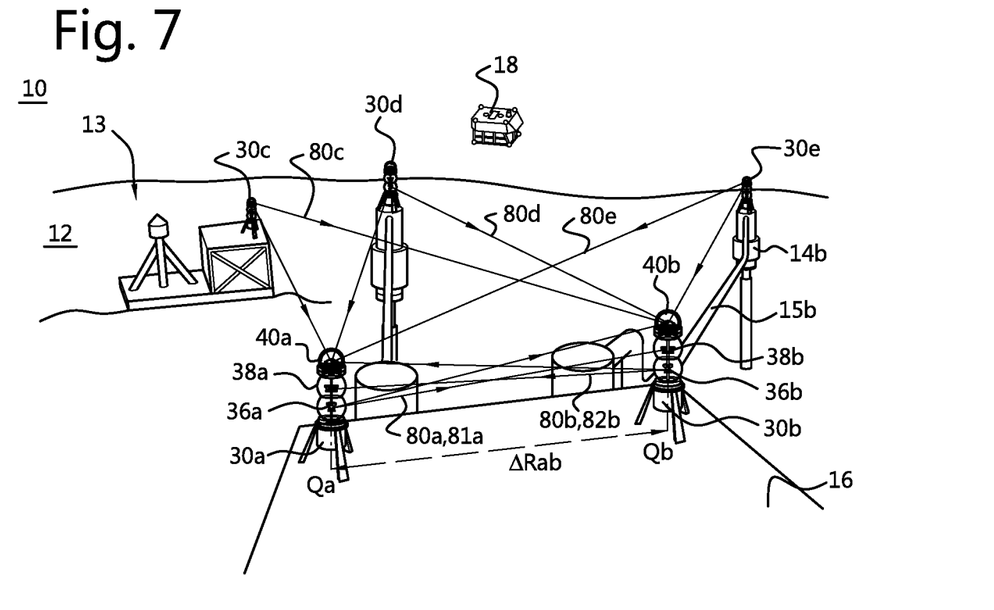
FIG. 7 illustrates a deployed observation system and a method for structure displacement monitoring according to embodiments.

A plurality of the proposed units 30 from FIGS. 2-4 can be deployed underwater to form an observation and monitoring system 20. FIG. 7 shows part of the exemplary system 20 in a deployed state, and illustrates a method for structure/asset displacement monitoring. The units 30a, 30b, 30c, 30d, 30e are configured to operate without external control, and to establish optical communication channels between pairs of units 30. The resulting communication channels may form a meshed network, wherein the units 30 form network nodes that cooperate to perform one or several observation and monitoring functions. The displacement monitoring method is explained with reference to the exemplary units 30 from FIG. 2-4, but it should be understood that equivalent units may be used as an alternative or in addition to such units 30.

In an initial deployment stage for the system 20, the observation units $30i$ (i=a, b, c, . . . ) are placed at non-coinciding locations Qi on the submerged surface 12 or structures 14, 16, such that each unit $30i$ is within visual and/or optical communication range with at least one other unit $30j$ (j=a, b, c, . . . ; j≠i). The relatively small units 30 may initially be placed by an underwater vehicle 18, for instance a ROV 18. The units 30 are deployed with inter-unit distances $\Delta Rij$ between each pair of units $30i$, $30j$ (e.g. $\Delta Rab$ between units 30a and 30b). In a (quasi-static) displacement monitoring mode, inter-unit distances $\Delta Rij$ of up to 200 meters or more may be achievable.

In order to conserve electrical power, the units 30 are configured to remain in a dormant mode for extended times, and to activate at predetermined time intervals and/or upon external request to perform measurements, to store measurement data, and/or to exchange measurement data. The processor 44 of each unit 30 is programmed with timing and/or external instruction protocols for activating the sensors 38, 40, 42 at predetermined periods and/or external request, and for storing the acquired data in the memory unit 44 and/or optically transmitting the acquired data to other units 30 in the network.

The signal transmitter 36a of a first observation unit 30a may emit light signals 80a, 81a (or 82a; not indicated in FIG. 6). The emission of light may occur continuously, intermittently after predetermined time intervals, or upon request by the ROV 18 or another nearby underwater vehicle (e.g. an UAV). A portion of this light signal 80a may be received by other cameras (e.g. 40b) of nearby observation units (e.g. unit 30b), yielding image data for each unit 30 within visual range. Via initial calibration procedures, the pixel region where a received light signal hits the imaging sensor 41 of the camera 40 can be associated with a set of two angular coordinates (e.g. an azimuth angle $\phi$ and an elevation angle $\Theta$, or direction cosine angles) relative to a local reference frame defined with respect to the camera 40.

During imaging with the camera 40, the orientation sensor 42 of each unit 30 acquires attitude data for this unit 30, by detecting changes in at least pitch, and roll angles for the camera 40 relative to the surface 13 or structure 14, 16 on/in which the unit 30 resides. The processor 44 of each unit generates positional information with angular coordinates for the detected external light sources, on the basis of the acquired image data with the attitude data. The positional information is referenced with respect to a common coordinate frame and provided with a timestamp corresponding to the time of measurement. The resulting data with timestamp is locally stored in the memory unit 46. The acquired image data and attitude data may also be separately stored in the memory unit 46, for downloading and post-processing purposes.

In addition, each of the units 30 may be configured to send optical interrogation signals 81 to another unit 30 via its signal transmitter 36, and to respond to an interrogation signal 81 received via the signal receiver 38 by emitting an optical response signal 82 via the signal transmitter 36. The processor 44 of each unit 30 may then be configured to execute a ranging function between this unit 30 and a specific other of the surrounding units that is within optical range, by determining time of flight (TOF) between the emitted interrogation signal 81 and a received response signal 82. The resulting TOF data may be stored in the memory unit 46 and/or transmitted via the communication device 35 to another unit 30.

As illustrated in FIG. 7, the first unit 30a emits an optical interrogation signal 81a, at time T0. The second unit 30b receives the signal at T0+ΔTab(=TOF), and sends an optical response signal 82b at T0+ΔTab+ΔTb(=fixed time offset) back to the first unit. The first unit may then receive this response signal 82b at T0+2·ΔTab+ΔTb. The units 30a-b are assumed to be stationary when communicating with each other, so the transmit and receive paths are assumed to be equidistant and associated with identical propagation times (TOFs) ΔTab. The first unit 30a determines a RTT 2·ΔTab+ΔTb between transmission of the interrogation signal 81a and receipt of the response signal 82b, to derive the TOF based on advance knowledge of the fixed time offset ΔTb. The processor 44 of the first unit 30a then determines an inter-unit distance ΔRab on the basis of the TOF and a pre-determined propagation speed for the light signals through the water 10.

Determination of one or more inter-unit distances ΔRij between pairs of units 30i, 30j may for instance be executed during an initial system calibration stage, soon after the units 30 have been deployed underwater. Once determined, such inter-unit distances ΔRij may be used as scaling information for the entire system 20 of deployed units 30. The angular positional data (e.g. azimuth, elevation, and inclination data) recorded by each unit 30 may then be supplemented with this scaling data, so that observations of light sources in the vicinity of the units 30 (e.g. ROV lights 19) can be mapped to full 3D positions.

Apart from the above, each unit 30 is configured to receive positional data of the other units 30 at predetermined times or upon request. The positional data is to be transmitted by each unit 30 via its communication device 35 to the other units 30. The processor device 44 of one unit 30 is configured to merge positional data (including timestamps) received from the other units 30, to form a merged dataset of time-dependent positional profiles for all observation units 30, which is stored in the memory unit 46.

The node positions can be computed from the recorded positional data (e.g. angular data and attitude data) and at least one known distance to determine the scale of the deployed system 20 (e.g. from one or more TOF-based inter-unit distances). The deployed system 20 can thus be used to accurately detect (e.g. sub-centimeter) relative motions (e.g. subsidence) between the deployed units 30, and parts of the surface 13 and assets 14, 16 on which the units 30 are deployed, by retrieving the merged dataset and analyzing the time-variations in the positional data. The method may for instance be used to estimate mechanical stresses between two locations of a submerged object (e.g. wellheads 14 and manifolds 16), or of structures (e.g. jumpers 15) interconnecting such objects, to provide a timely indication of potential structure failure.

The underwater vehicle 18 may include a wireless optical communication device (not shown), which is configured to address any unit 30 and request for a transmission of positional data. Such a vehicle 18 may move within communication range of a selected unit 30, and request the unit 30 for a transmission of network measurements. The addressed unit 30 may then upload its current merged dataset of time-dependent positional profiles to the vehicle 18.

The system 20 may additionally include an acoustic modem (not shown), configured to upload positioning data to a vehicle at the surface of the sea 10. Alternatively or in addition, one or more of the units 30 may be in signal communication via a wired connection with a nearby underwater data access point (also not shown).

Figure 8:
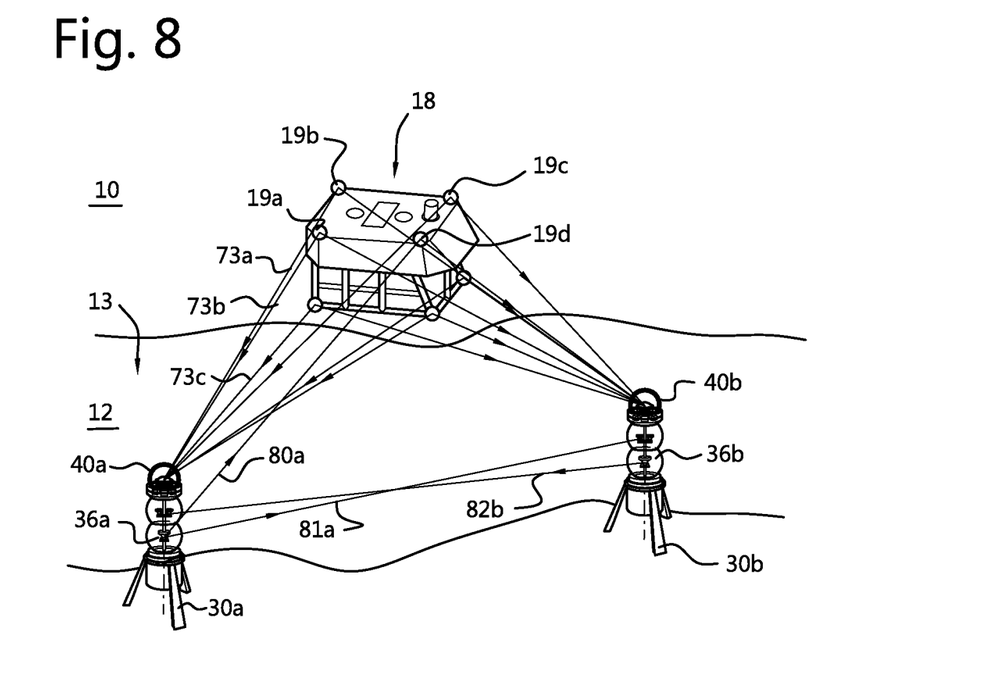
FIG. 8 illustrates a deployed observation system and a method for enhancing position information for an underwater vehicle according to embodiments.

FIG. 8 shows part of the exemplary observation system 20 from FIGS. 1-5 in a deployed state, and illustrates a method for enhancing position information for an underwater vehicle 18 e.g. an ROV. In an initial calibration stage for the deployed system 20, the observation units 30 may exchange interrogation and response signals 81, 82, in order to determine inter-unit distances ΔRij via methods described herein above.

The ROV 18 may be fitted with a plurality of wireless optical communication devices 19, each including an optical signal transceiver that is configured to emit light 73, and to receive optical signals 80 from the signal transmitters 36 of nearby observation units 30.

The ROV 18 may be configured to serve as a master node for the system 20. This master node is configured to establish the common network time of the system 20, and to synchronize time for all the units 30 in the network by broadcasting timing information via its optical communication device to the units 30j. The master node is further configured to define tasks that individual units 30j need to execute per measurement cycle, and to transmit instructions to a specific unit 30j via communication device. Alternatively, one or several of the observation units 30 in the system 20 may be configured to function as the master node during different periods.

The underwater imaging devices 40a, 40b observation units 30a, 30b in visual range of the ROV lights 73 acquire image data of these lights 73. The processor device 44a, 44b of each unit 30 may then determine positional data associated with of the ROV relative to the imaging device 40, via methods described herein above. The communication device 35a, 35b of each unit 30 may then transmit this positional data to the ROV 18 upon request, via optical signals 80 that may be received by any or all of the ROV's communication devices 19 that have a line of sight to that unit 30. Only optical signal 80a from unit 30a to ROV communication device 19d is shown in FIG. 8 for clarity, but it should be understood that other units 30 may communicate positional information to any or all ROV devices 19.

The system 20 may be kept deployed in dormant mode on the seafloor 13 and structures 14, 16 for a long time, but may be woken up by the ROV 18 (or another underwater vehicle) entering the site, and ordered to start tracking and broadcasting the 6DOF position of the ROV 18.

Any or all units 30 in the system 20 can also be ordered by the ROV 18 to record images of the environment with the static cameras 40 with omnidirectional views. During such recording, the ROV 18 may project light (e.g. diffuse light or laser stripes) onto the otherwise dark scene. Full panoramic image data, or landmark features extracted from those images by the units 30, may be transmitted together with positional reference data to the ROV 18 upon request.

The system 20 may be configured to operate in a single mode, and switch to another single mode upon request. The system 20 may also be configured to operate in multiple modes at the same time, and to de-activate one of the current modes and/or activate one or more modes upon request by the ROV 18. The system 20 may thus be efficiently used for different purposes and perform alternative measurements upon request, while saving energy when particular modes of operation are not desired.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. It will be apparent to the person skilled in the art that alternative and equivalent embodiments of the invention can be conceived and reduced to practice. All changes which come within the meaning and range of equivalency of the claims are to be embraced within their scope.

In the above exemplary system, the UWOC units were configured to perform inter-unit ranging by determining TOF for optical signals travelling between the units. In alternative embodiments, the UWOC units 30 may be configured to perform inter-unit ranging by comparing carrier phase and frequency characteristics of the optical signals from the units. FIG. 7 is used again to illustrate that the units 30 are initially deployed at respective positions (e.g. Qa, Qb) on the seafloor 13, with initially unknown inter-unit distances $\Delta Rij$ (e.g. distance $\Delta Rab$ between units 30a and 30b).

At time T0, the first unit 30a transmits an optical interrogation signal 81a with carrier wave characteristics $S_a(t)=\omega_a \cdot t+\varphi_a$ to the second unit 30b via its signal transmitter 36a. Here, $\omega_a$ is the angular frequency and $\varphi_a$ is the initial phase shift of carrier wave $S_a$. The second unit 30b receives the interrogation signal 81a via its signal receiver 38b, at time $T1=T0+\Delta Tab(=TOF)$. The processor 44b of the second unit 30b may then compare the received interrogation signal 81a with the frequency and phase characteristics $S_b(t)$ of its own clock used for emitting an optical response signal. If these carrier wave characteristics are characterized by $S_b(t)=\omega_b \cdot t+\varphi_b$, then the resulting phase comparison data $\Delta\varphi_{ba}$ may correspond to $$\Delta\varphi_{ba}(T1) = (\omega_b - \omega_a) \cdot T1 + \frac{\Delta Rab}{c_w} \cdot \omega_a + (\varphi_b - \varphi_a)$$

with $c_w$ an estimated, measured, or otherwise known propagation speed for the optical signal through the surrounding water 10. In addition, the second unit 30b may derive frequency comparison data $\Delta\omega_{ba}=\omega_b-\omega_a$. The phase comparison data $\Delta\varphi_{ba}$ and possibly the frequency comparison data $\Delta\omega_{ba}$ are stored by the second unit 30b.

At a later time $T0+\Delta Tab+\Delta Tb(=\text{delay})$, the second unit 30b emits an optical response signal 82b via a carrier wave with characteristics $S_b(t)$, using its signal transmitter 36b. The optical response signal 82b additionally includes or is accompanied by the phase comparison data $\Delta\varphi_{ba}$, and may also include the frequency comparison data $\Delta\omega_{ba}$.

The first unit 30a receives the response signal 82b via its signal receiver 38a at later time $T2=T0+2\cdot\Delta Tab+\Delta Tb$, assuming that $\Delta Tba=\Delta Tab$. The processor 44a of the first unit 30b may then compare the received response signal 82b with the frequency and phase characteristics $S_a(t)$ of its own clock, via $$\Delta\varphi_{ab}(T2) = (\omega_a - \omega_b) \cdot T2 + \frac{\Delta Rab}{c_w} \cdot \omega_b + (\varphi_a - \varphi_b)$$

The first processor 44a may then perform a ranging function between the two unit 30a, 30b, by deriving the inter-unit distance $\Delta Rab$ from the phase difference measurements of the two units 30a-b via $$\Delta Rab = \frac{c_w \cdot (\Delta\varphi_{ba}(T1) + \Delta\varphi_{ab}(T2) + (\omega_a - \omega_b) \cdot (T1 - T2))}{\omega_a + \omega_b}$$

Any integer clock/wave period-based ambiguities in the above difference determination may be resolved by modulating the interrogation and response signals 81a, 82b with predetermined periodic data patterns having periods that significantly exceed the periods of the carrier waves.

Optional determination and transmission of frequency comparison data $\Delta\omega_{ba}$ by the second unit 30b and receipt thereof by the first unit 30a, allows the first unit 30a to first determine an average value for the frequency difference $\Delta\omega ab=\omega_a-\omega_b$, or to detect and possibly compensate for potential frequency drift between the two measurement times T1 and T2.

In the above examples, the camera FOV had an azimuthal coverage $\Delta\phi v$ of 360° and an elevational coverage $\Delta\Theta v$ of −20° to +90°. Depending on the application and desired vertical observational range, the elevational coverage $\Delta\Theta v$ may be reduced to the range −20° to +30°, or may be increased to the range −50° to +90°.

The skilled person will appreciate that the component casing 52 may consist essentially of materials different than titanium. Other suitable materials are e.g. stainless steel, electrogalvanized steel, aluminum, or other sufficiently rigid materials that are corrosion-resistant or otherwise provided with an external coating of anti-corrosion material.

Also, the shape of the medial portions 51, 52 of the unit's housing 32 should not be considered limited to stacked truncated spheroids. Instead, a medial housing portion with a cylindrical shape, or another shape with rotational symmetry about the unit axis A, would be possible.

Furthermore, the power supply 48 was formed in the above examples as a replaceable seawater battery, but may alternatively be formed by other suitable water-compatible and pressure-resistant power supply arrangements. For instance, a pressure-tolerant non-rechargeable alkaline battery pack may be used in monitoring units for long-term deployment (e.g. long-term displacement monitoring mode), or rechargeable nickel-metal hydride (NiMh) batteries in a pressure housing may be used in monitoring units that are only deployed for a short period (e.g. in positioning mode).

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. For instance, the image processing functionalities on the one hand, and the optical communication and network management tasks on the other hand, may be controlled by separate processor devices provided in the same underwater observation unit.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

LIST OF REFERENCE SYMBOLS 10 body of water (e.g. seawater)
12 submerged earth layer (e.g. seafloor, ocean floor)
13 submerged earth surface
14 submerged structure (e.g. wellhead)
15 coupling conduit (e.g. jumper)
16 further submerged structure (e.g. manifold)
18 underwater vehicle (e.g. remotely operable vehicle, or unmanned autonomous vehicle)
19 vehicle light
20 underwater wireless optical communication (UWOC) system
22 underwater beacon unit
30 UWOC unit
32 housing
34 base
35 optical communication device
36 optical signal transmitter
38 optical signal receiver
40 underwater imaging device (e.g. photogrammetric camera)
41 imaging sensor
42 orientation sensor
44 processor
46 memory unit
48 power supply (e.g. battery)
50 first medial housing portion (e.g. first solid transparent dome)
51 second medial housing portion (e.g. second solid transparent dome)
52 component casing
53 cable router tube
54 transparent dome
56 distal housing portion
58 refractor optics (e.g. fish-eye lens)
60 first reflector optics (e.g. parabolic conical reflector)
61 second reflector optics (e.g. parabolic conical reflector)
62 optical detector
63 frontend circuit
64 Silicon photomultiplier (SiPM)
65 SiPM sensor element
66 parallel LC filter
67 bias voltage source
68 analog-to-digital converter (ADC)
69 low pass RC filter
70 light source (e.g. LED)
72 external light source
73 vehicle light signal (e.g. ROV LED)
80 light signal
81 optical interrogation signals
82 optical response signal
83 further light signal
X first direction (longitudinal direction)
Y second direction (transversal direction)
Z third direction (vertical direction/axial direction)
R radial direction
$\phi$ first angular direction (azimuthal direction)
$\Theta$ second angular direction (elevation direction)
$\Delta\phi v$ FOV azimuthal range
$\Delta\Theta v$ FOV elevation range
$\Delta Z u$ unit height
$\emptyset u$ unit diameter
$P_{\phi d}$ azimuthal plane (of camera dome)
$P_{\phi t}$ azimuthal plane (of optical signal transmitter)
$P_{\phi r}$ azimuthal plane (of optical signal receiver)
Ps sensor plane
i index for UWOC unit (i=a, b, c, . . . )
j further index for UWOC unit (j=a, b, c, . . . ; j≠i)
Cd dome center
Ct first center of curvature (e.g. at/near optical signal transmitter)
Cr second center of curvature (e.g. at/near optical signal receiver)
Ai nominal unit axis (of unit i)
Qi unit position (of unit i)
$\Delta Rij$ inter-unit distance (from unit i to j)

The invention claimed is:

1. An underwater wireless optical communication (UWOC) unit for underwater deployment on or in a submerged earth layer or a submerged structure, wherein the UWOC unit is configured for wireless optical communication in an underwater environment and comprises:
    an optical transmitter, configured to transmit data by emitting an optical signal into the surroundings of the UWOC unit;
    an anidolic optical receiver including an optical detector, which is omnidirectionally sensitive and configured to receive a further optical signal approaching substantially along a first azimuthal plane that is orthogonal to a nominal axis extending through the UWOC unit, and a processor, communicatively coupled to the optical receiver, and configured to process received further optical signals, wherein the processor is configured to determine an indication of an inter-unit distance between the first UWOC unit and a second UWOC unit, on the basis of sending with the optical transmitter an optical interrogation signal to the second unit, and receiving with the optical receiver an optical response signal from the second unit.

2. The UWOC unit according to claim 1, wherein the optical transmitter is configured to omnidirectionally emit the optical signal substantially along a second azimuthal plane, which is substantially parallel with the first azimuthal plane.

3. The UWOC unit according to claim 1, configured to send with the optical transmitter an optical response signal to the second unit, upon receiving an optical interrogation signal from the second unit.

4. The UWOC unit according to claim 1, wherein the optical detector comprises a silicon photomultiplier, SiPM, sensor.

5. The UWOC unit according to claim 1, wherein the optical detector defines a sensor surface, and wherein the optical signal receiver comprises first reflector optics, being adapted to receive the further optical signal approaching substantially along the first azimuthal plane, and to reflect the further optical signal towards and onto the sensor surface.

6. The UWOC unit according to claim 5, wherein the sensor surface is substantially planar, wherein the first reflector optics includes a conical mirror with a top directed towards the optical detector, wherein the conical mirror is centered on an axis of revolution that extends through the sensor region and is substantially parallel with the nominal axis.

7. The UWOC unit according to claim 5, wherein the first reflector optics includes a plurality of conical mirrors arranged rotationally symmetric around the unit axis, each mirror being centered on an axis of revolution that extends through the sensor region and is at a non-zero distance from and substantially parallel with the nominal axis.

8. The UWOC unit according to claim 5, comprising a housing including an optically transparent body formed by a solid of revolution, which is centered on the unit axis and has an outer surface with a convex curvature along radial and axial directions and a center of curvature located on the unit axis, wherein the first reflector optics are accommodated inside the transparent body and substantially at the center of curvature.

9. The UWOC unit according to claim 4, wherein the SiPM sensor includes sensor elements and a frontend circuit, which includes a voltage source for providing the sensor elements with a reversed bias voltage, and a low-pass filter, which is provided between and electrically connected to the sensor elements and the voltage source, and which is configured to suppress or eliminate frequency components of 100 hertz and above in/from the bias voltage.

10. The UWOC unit according to claim 4, wherein the optical transmitter is configured to form the optical signal by modulating a carrier wave with a frequency of at least 500 kilohertz using a modulation with a predetermined maximum bitrate, and wherein the SiPM sensor includes a frontend circuit including an analogue-to-digital converter, ADC, and a parallel resonant band-pass filter, which is provided between and electrically connected to the sensor elements and the ADC, and which is configured to pass only a frequency band corresponding with the carrier wave and the maximum bitrate.

11. The UWOC unit according to claim 6, wherein the conical mirror includes an inverse parabolic conical mirror surface.

12. The UWOC unit according to claim 7, wherein the conical mirrors include inverse parabolic conical mirror surfaces.

13. The UWOC unit according to claim 10, wherein the parallel resonant band-pass filter is a parallel L/C filter provided between and electrically connected to the sensor elements and the ADC, and configured to pass only a frequency band corresponding with the carrier wave and the maximum bitrate.

* * * * *